United States Patent [19]
Taoda

[11] Patent Number: 5,418,744
[45] Date of Patent: May 23, 1995

[54] DATA TRANSFER APPARATUS

[75] Inventor: Masami Taoda, Yokohama, Japan

[73] Assignee: Kabushiki Kaisha Toshiba, Kawasaki, Japan

[21] Appl. No.: 195,029

[22] Filed: Feb. 14, 1994

[30] Foreign Application Priority Data

Feb. 26, 1993 [JP] Japan .................. 5-037759

[51] Int. Cl.⁶ .............................. G11C 7/00
[52] U.S. Cl. ...................... 365/189.05; 365/189.01; 365/236; 395/250
[58] Field of Search ............ 365/189.05, 189.01, 365/230.08, 195, 236; 395/200, 250

[56] References Cited

U.S. PATENT DOCUMENTS

| | | | |
|---|---|---|---|
| 4,224,481 | 9/1980 | Russell | 365/215 |
| 4,891,788 | 1/1990 | Kreifels | 365/230.08 |
| 4,922,437 | 5/1990 | Sakata et al. | 364/514 |
| 5,083,269 | 1/1992 | Syobatake et al. | 365/189.05 |
| 5,280,584 | 1/1994 | Caesar et al. | 395/250 |
| 5,305,253 | 4/1994 | Ward | 365/189.05 |

FOREIGN PATENT DOCUMENTS 58-201165 11/1983 Japan .

Primary Examiner—Joseph A. Popek
Assistant Examiner—Tan Nguyen
Attorney, Agent, or Firm—Cushman Darby & Cushman

[57] ABSTRACT

An external device for sending data can execute write access by the control of a buffer memory management unit and an access control unit only when an empty area is present in a buffer memory area of a memory designated by an area designating unit of the buffer memory management unit. Another external device for receiving data can execute read access by the control of the buffer memory management unit and an access control unit only when data is stored in the buffer memory area. The external devices with different processing speeds can transfer data asynchronously.

5 Claims, 9 Drawing Sheets

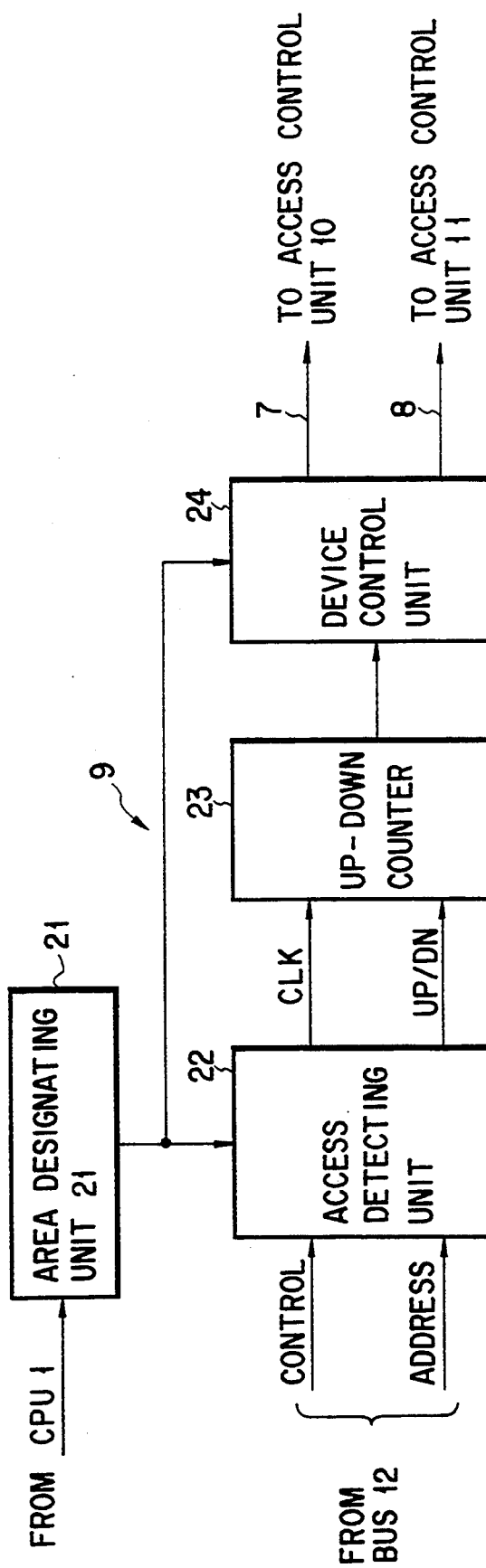
F I G. 4

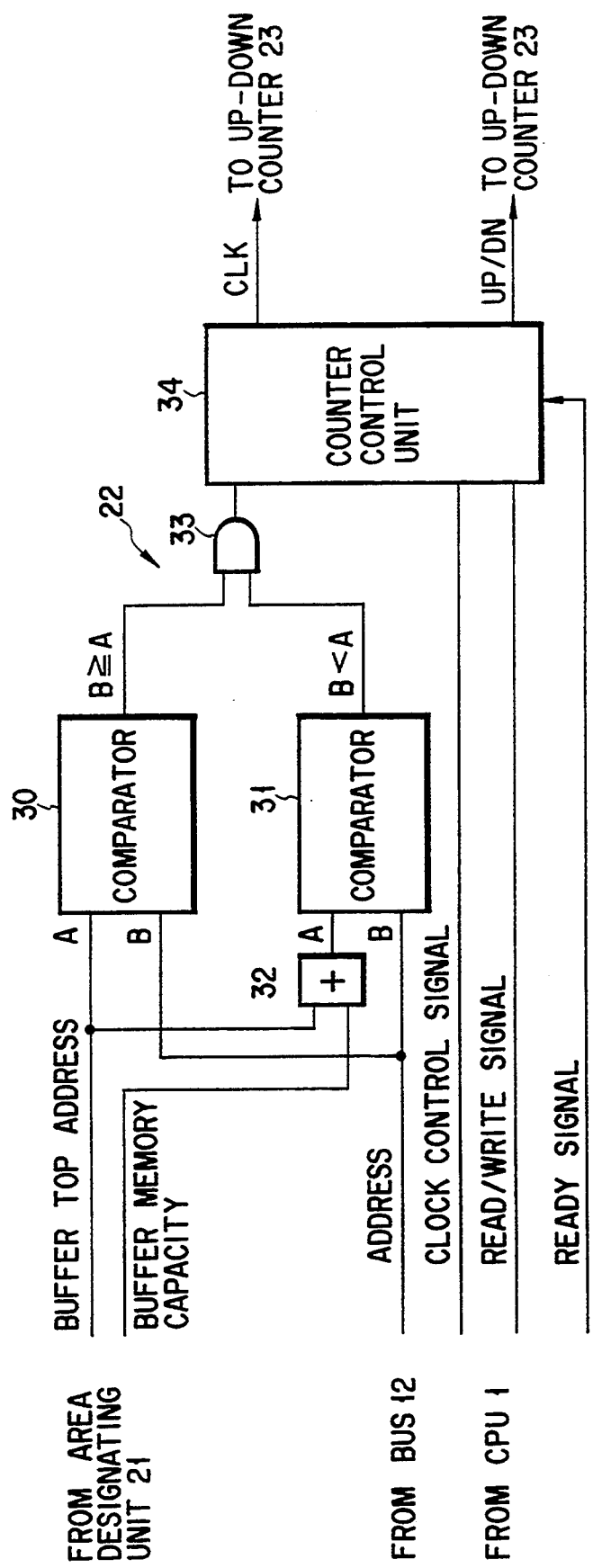
F I G. 6

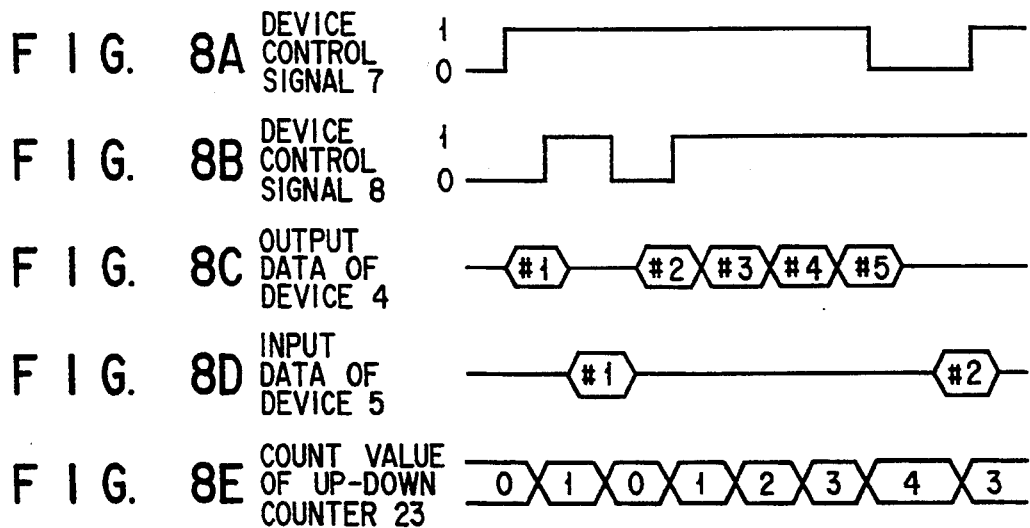
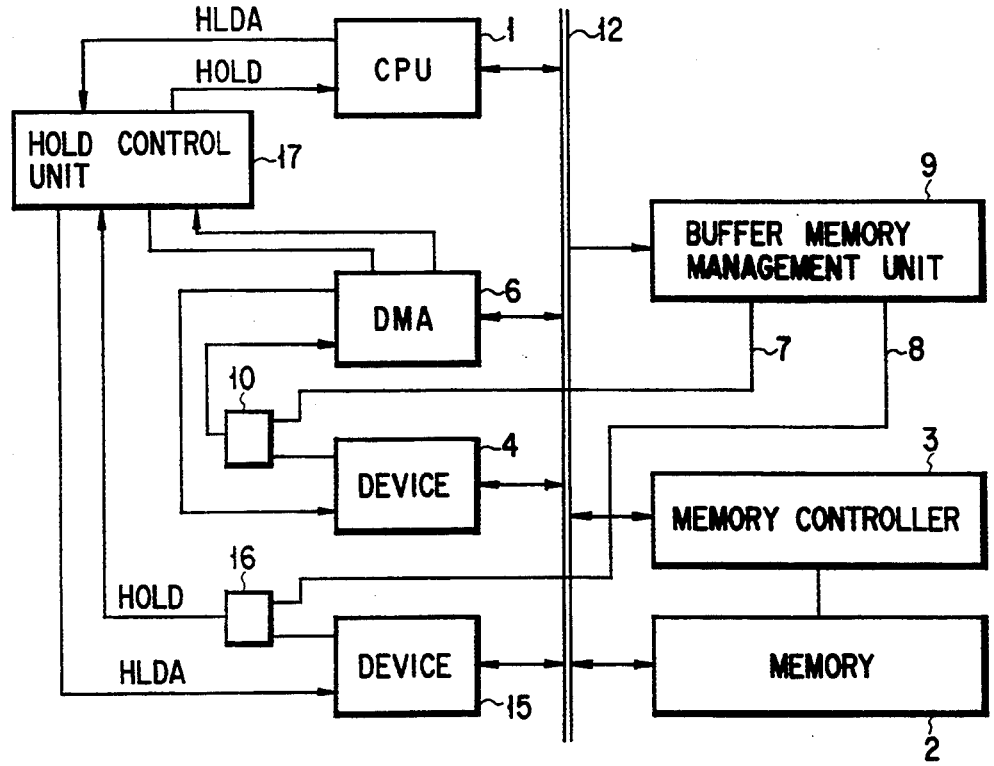
F I G. 9

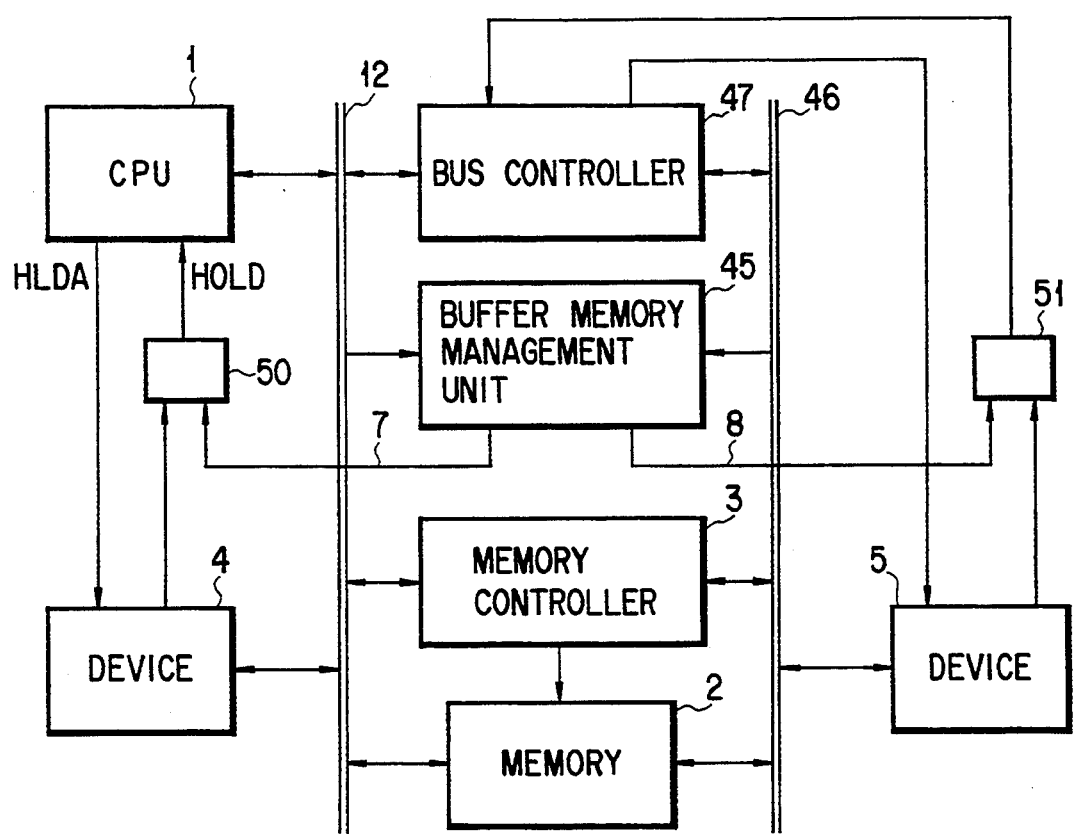
F I G. 13

DATA TRANSFER APPARATUS

BACKGROUND OF THE INVENTION

1. Field of the Invention

The present invention relates to a data transfer apparatus for transferring data, wherein a given portion of a memory is used as a buffer memory area.

2. Description of the Related Art

In conventional systems for transferring data between a plurality of devices (e.g. optical disk apparatus), data transfer between non-synchronous devices with different processing speeds is effected by various methods. For example, there is a method in which data transfer is started when access requests between both devices coincide. In a single buffer method, data of a predetermined size is temporarily transferred to a memory from a transmitter-side device, and thereafter a receiver-side device receives the data from the memory. In a double buffer method, two buffer memory systems are provided, and, after one of the buffer memory systems is filled with data, a receiver-side device starts a read access, during which time a transmitter-side device executes write access to the other buffer memory system.

In the method in which data transfer is started when access requests between both devices coincide, a bus is occupied while access requests are being awaited, resulting in a delay in access. Furthermore, if data widths are different between both devices, direct data transfer cannot be executed. In this case, data transfer is executed on the basis of the device with less data width. On the other hand, in the case of the single buffer method or double buffer method, the data transfer speed decreases because of a time for filling the buffer memory with data or overhead due to software control.

Jap. Pat. Appln. KOKAI Publication No. 58-201165 discloses a data rearrangement circuit, which is an example of a conventional double-buffer type circuit. This data rearrangement circuit is characterized by comprising two buffer memories having areas, the addresses of which can be optionally determined, and an address controller for controlling inputs and outputs independently with respect to addresses of the two buffer memories and designating output addresses in an optional order different from the order of input addresses. Specifically, the data rearrangement circuit includes two buffer memories. Data write is effected in one of the buffer memories, and data read is effected in the other buffer memory. For example, while data write is being performed in one buffer memory, data read is executed in the other buffer memory. Thereby, transfer speed is increased.

The double buffer method, however, has some drawbacks. For example, the operation of one device is suspended until one of the buffer memories is filled with data by the other device. In addition, since software control is executed when the buffer memory is switched, high-speed data transfer cannot be performed.

SUMMARY OF THE INVENTION

The object of the present invention is to provide a data transfer apparatus for transferring data at high speed between asynchronous devices with different processing speeds, and for transferring data at high speed between devices with different data widths.

This object can be achieved by an apparatus for transferring data from a first device to a second device, comprising:

a buffer memory for temporarily storing data from the first device, the buffer memory having a predetermined data capacity;

means for detecting the amount of data stored in the buffer memory;

first access means for accessing the buffer memory to transfer data from the first device to the buffer memory, the first access means including first control means for disabling data transfer when the detecting means has detected that the amount of data stored in the buffer memory is equal to the predetermined data capacity; and second access means for accessing the buffer memory to transfer data from the buffer memory to the second device, the second access means including second control means for disabling data access when the detecting means has detected that no data is stored in the buffer memory.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 shows the structure of a buffer memory management unit;

FIG. 6 shows an example of the structure of an access detecting unit;

FIGS. 8A to 8E are timing charts illustrating the data transfer operation;

FIG. 9 shows schematically the structure of a system according to another embodiment of the invention;

FIG. 13 shows schematically the structure of still another embodiment of the invention.

DETAILED DESCRIPTION OF THE PREFERRED EMBODIMENTS

Preferred embodiments of the present invention will now be described with reference to the accompanying drawings.

Figure 1:
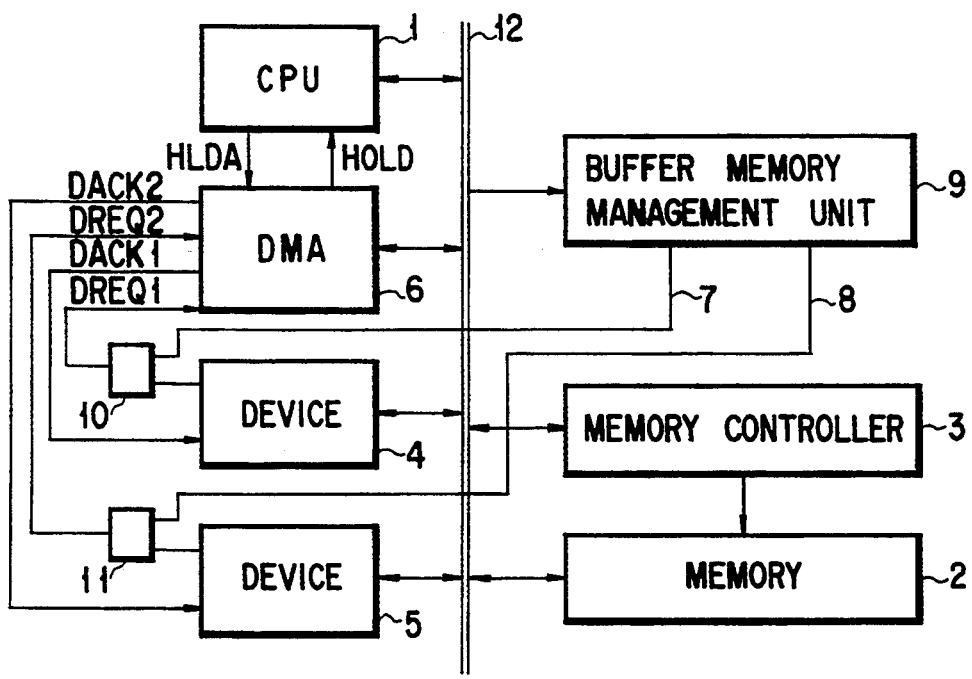
FIG. 1 is a block diagram showing schematically the structure of an entire system having a data transfer apparatus according to an embodiment of the present invention.

FIG. 1 shows schematically the structure of an entire system having a memory control apparatus according to an embodiment of the present invention. Specifically, the system comprises a CPU 1 for controlling the entire system, a memory 2 for storing programs and data, a memory controller 3 for controlling access to the memory 2, devices 4 and 5, such as optical disk apparatuses, for data transmission/reception, a direct memory access controller (DMA) 6 functioning as data transfer means for effecting access (read/write) to the memory 2 in response to request signals (transfer request signals) from the devices 4 and 5, a buffer memory management unit 9 for defining a buffer memory area within the memory 2 and generating device control signals 7 and 8, an access control unit 10 for controlling a request signal of access (read/write) to the device 4 on the basis of the device control signal 7, and an access control unit 11 for controlling a request signal of access (read/write) to the device 5 on the basis of the device control signal 8.

The CPU 1, memory 2, memory controller 3, device 4, device 5, DMA 6 and buffer memory management unit 9 are interconnected by a common bus 12.

Figure 2:
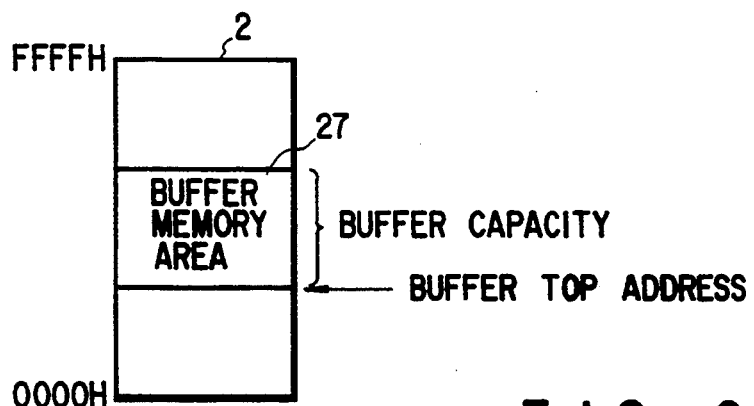
FIG. 2 shows the structure of a memory in which a buffer memory area is defined.

FIG. 2 shows the structure of the memory 2 in which a buffer memory area 27 is defined. Although the details will be described later, the buffer memory area 27 is defined by a buffer top address and a buffer capacity both set by the CPU 1.

Figure 3A:
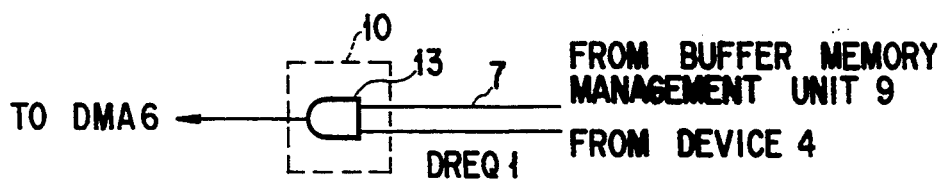
FIGS. 3A and 3B show examples of the structure of an access control unit.
Figure 3B:
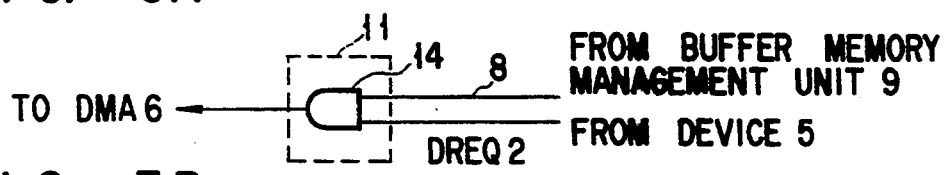

FIG. 3A and FIG. 3B show examples of the structures of the access control units 10 and 11 which comprise simplest AND circuits 13 and 14. It should be noted, however, that the present invention is not limited to this structure.

In this embodiment, data is transferred from the device 4 to the device 5 via the buffer memory area 27 of the memory 2. The present invention, however, is not limited to this structure.

In FIG. 3A, the device control signal 7 from the buffer memory management unit 9 is set at "1" when the write access (write to memory 2) by the device 4 is enabled, and the device control signal 7 is set at "0" when the write access is disabled.

For example, when the device control signal 7 is set at "1" indicating the access enable state and a write access request (transfer request) signal "1" has been output from the device 4 to the access control unit 10, the AND circuit 13 outputs to the DMA 6 a signal DREQ1 having value "1". The DMA 6 receives the signal DREQ1 and starts the write access by the device 4.

When the device control signal 7 is set at "0" indicating the access disable state and the write access request signal "1" has been output from the device 4 to the access control unit 10, the output of the AND circuit 13 has "0" and the signal DREQ1 is not output to the DMA 6. The DMA 6 does not start write access by the device 4.

Similarly, in FIG. 3B, when the device control signal 8 from the buffer memory management unit 9 is set at "1" when the read access (read from memory 2) by the device 5 is enabled. When the read access is disabled, the signal 8 is set at "0".

For example, when the device control signal 8 is set at "1" indicating the access enable state and a read access request (transfer request) signal "1"0 has been output from the device 5 to the access control unit 11, the AND circuit 14 outputs to the DMA 6 a signal DREQ2 having value "1". The DMA 6 receives the signal DREQ2 and starts the read access by the device 5.

When the device control signal 8 is set at "0" indicating the access disable state and the read access request signal "1" has been output from the device 5 to the access control unit 11, the output of the AND circuit 14 has "0" and the signal DREQ2 is not output to the DMA 6. The DMA 6 does not start read by the device 5.

As has been described above, the access control unit 10 controls the request signal for the write access by the device 4 on the basis of the device control signal 7 supplied from the buffer memory management unit 9. Similarly, the access control unit 11 controls the request signal for the read access by the device 5 on the basis of the device control signal 8 supplied from the buffer memory management unit 9.

FIG. 4 shows the structure of the buffer memory management unit 9. Specifically, the buffer memory management unit 9 comprises an area designating unit 21 for designating the buffer memory area 27 of the memory 2, an access detecting unit 22 for detecting the state in which the buffer memory area 27 designated by the area designating unit 21 is accessed (read/write access by device 4 or 5), an up-down counter 23 for counting the data storage state in the buffer memory area 27, and a device control unit 24 for outputting device control signals 7 and 8 in accordance with the result of the up-down counter 23.

Figure 5:
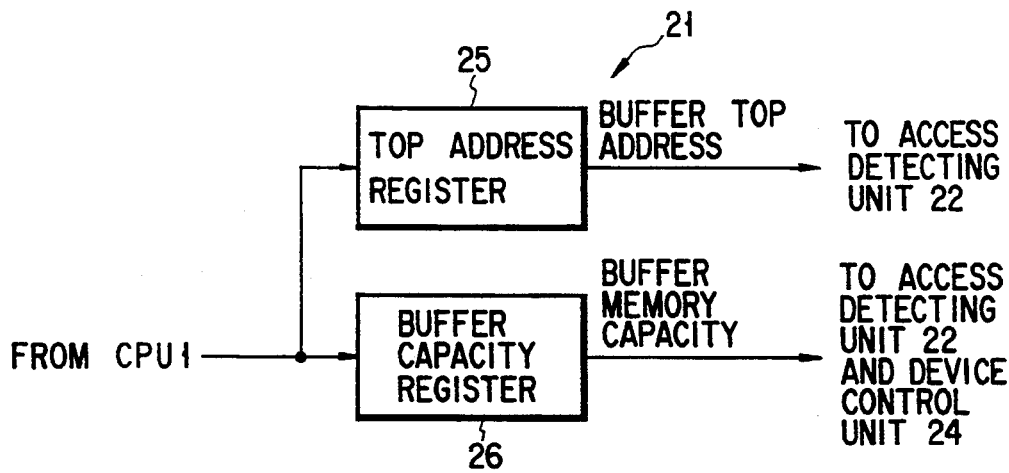
FIG. 5 shows an example of the structure of an area designating unit.

FIG. 5 shows an example of the structure of the area designating unit 21 which comprises a top address register 25 set by the CPU 1 and a buffer capacity register 26. The buffer memory area 27 is defined on the memory 2 on the basis of the top address and the buffer capacity set by the CPU 1. Specifically, the top address register 25 outputs the buffer top address set by the CPU 1 to the access detecting unit 22, and the buffer capacity register 26 outputs a signal representing the buffer capacity set by the CPU 1 to the access detecting unit 22 and the device control unit 24.

FIG. 6 shows an example of the structure of the access detecting unit 22 which comprises comparators 30 and 31, an adder 32, an AND circuit 33 and a counter control unit 34 for controlling the up-down counter 23.

For example, when data access (read/write) is executed on the memory 2 by the CPU 1 or DMA 6, the comparator 30 in the access detecting unit 22 compares a data address B detected via the bus 12 and a buffer top address A from the area designating unit 21. If $B \geq A$, value "1" is output. The comparator 31 compares an address A obtained by adding the buffer capacity to the buffer top address from the area designating unit 21 by means of the adder 32 and an address B detected via the bus 12. If $B < A$, value "1" is output.

By the outputs from the comparators 30 and 31, the access (read/write) to the buffer memory area 27 of the memory 2 is controlled. Specifically, in the case of an address exceeding the buffer capacity from the top address of the buffer memory area 27 on the memory 2, the output of the comparator 31 is "0" and the output of the AND circuit 33 is "0". Inversely, in the case of an address prior to the top address, the output of the comparator 30 is "0" and the output of the AND circuit 33 is "0", and the counter control unit 34 is not operated. That is, in this case, the access to the buffer memory area 27 cannot be accessed.

Accordingly, the counter control unit 34 operates when the AND circuit 33 has received output "1" from the comparator 30 and output "1" from the comparator 31 and has outputted signal "1".

The counter control unit 34 outputs to the up-down counter 23 a clock signal CLK with a variation amount of the count value which corresponds to the data width of the data to be accessed and the clock control signal from the CPU 1. In addition, the counter control unit 34 outputs to the up-down counter 23 a control signal (UP/DN) for count-up when the read/write signal from the CPU 1 is a read signal and outputs a control signal (UP/DN) for count-down when the read/write signal from the CPU 1 is a write signal. The counter control unit 34 receives a ready signal from the CPU 1 and changes the count value of the up-down counter 23 to "0".

The up-down counter 23 receives the clock signal CLK and count down/up control signal from the access detecting unit 22 and starts counting, and outputs the count value to the device control unit 24.

Figure 7:
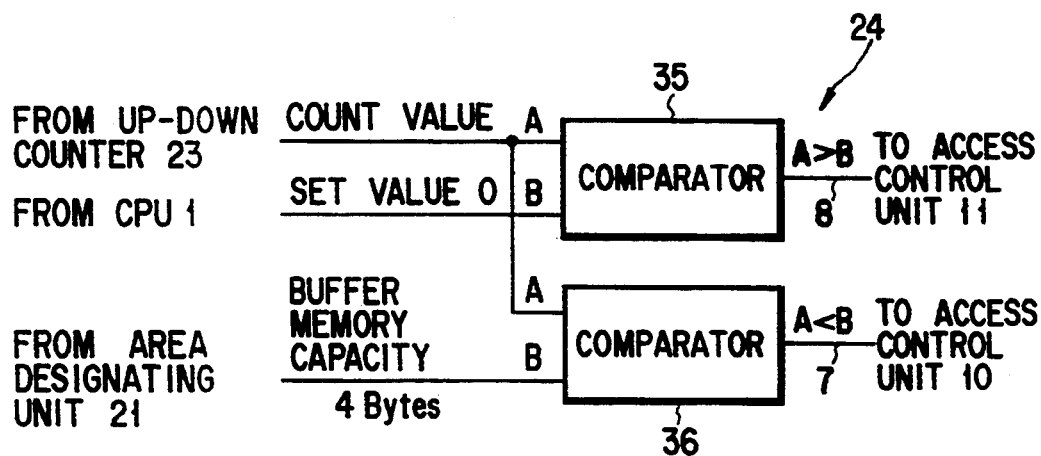
FIG. 7 shows an example of the structure of a device control unit.

FIG. 7 shows an example of the structure of the device control unit 24 which comprises comparators 35 and 36. The comparator 35 compares a count value A from the up-down counter 23 and a value B ("0" in this case) set by the CPU 1. When A>B, a device control signal A having value "1" is output to the access control unit 11. The value "0" is set in this case, because it is determined that data is stored in the buffer memory area 27 of the memory 2 when the count value from the up-down counter 23 exceeds "0", and it is determined that data is not stored in the buffer memory area 27 when the count value is "0".

Specifically, when the count value is "0", no data is stored in the buffer memory area 27 of the memory 2 and therefore the read access to the device 5 is not executed. In the present embodiment, in the case of the count value "0", the condition "A>B" is not met. Thus, the comparator 35 outputs device control signal 8 having value "0" to the access control unit 11. Accordingly, the DMA 6 does not enable the device 5, which is controlled by the access control unit 11, to perform read access. The reason for this is that even if the read access request signal "1" is output to the access control unit 11, the device control signal 8 input to the AND circuit 14 of the access control unit 11 is "0" and therefore the signal DREQ 2 is not output to the DMA 6.

The comparator 36 compares the count value A from the up-down counter 23 and the buffer memory capacity data B ("4" if the memory capacity is 4 bytes) from area designating unit 21. When A<B, device control signal 7 having value "1" is output to the access control unit 10. When 4 bytes of data have been written in the buffer memory area 27 of the memory 2 (i.e., when the buffer memory area 27 has been filled with write data), the condition of A=B is met and the comparator 36 outputs the device control signal 7 having value "0" to the access control unit 10. Accordingly, the DMA 6 does not enable the device 4, which is controlled by the access control unit 10, to perform write access. The reason for this is that even if the write access request signal "1" is output to the access control unit 10, the device control signal 7 input to the AND circuit 13 of the access control unit 10 is "0" and therefore the signal DREQ 1 is not output to the DMA 6.

Although the device control signal 7 is output to the access control unit 10 and the device control signal 8 is output to the access control unit 11, this invention is not limited to this construction.

Referring to the timing charts of FIGS. 8A to 8E, the actual data transfer by use of the buffer memory area 27 of the above-described system will now be described.

For the purpose of simplicity, suppose that the buffer memory capacity is 4 bytes and the transfer data width in both devices 4 and 5 is in units of 1 byte. In addition, suppose that data is transferred from the device 4 to device 5 via the buffer memory area 27 of the memory 2.

The CPU 1 defines the buffer memory area 27 of memory 2 by use of the area designating unit 21 of the buffer memory management unit 9, as described above, and sets the count value of the up-down counter 23 at "0".

In the device control unit 24, the comparator 36 compares the counter value "0" of the up-down counter 23 and the count value "4" representing 4 bytes of the buffer memory capacity. As a result, the comparator 36 outputs the device control signal 7 having value "1" to the access control unit 10. In addition, the comparator 35 compares the count value "0" of the up-down counter 23 and the input B of set value "0" and outputs the device control signal 8 having value "0" to the access control unit 11.

The access control unit 10 receives the device control signal 7 having value "1" and enables the device 4 to execute write access. The access control unit 11 receives the device control signal 8 having value "0" and disables the device 5 from executing read access.

Subsequently, the CPU 1 starts the operations of the devices 4 and 5.

The device 4 outputs the request signal "1" to the access control unit 10 in order to output data. In the access control unit 10, the access control unit 10 receives the device control signal 7 with value "1" and request signal "1" and outputs a signal "1" to the DMA 6 as signal DREQ1.

On the other hand, even if the device 5 outputs the request signal "1" to the access control unit 11, the access control unit 11 receives the device control signal 8 with value "0" and request signal "1" and the AND circuit 14 outputs value "0". Thus, the signal DREQ2 is not output and it is not received by the DMA6.

The DMA 6 receives the DREQ1 and outputs a HOLD signal to the CPU 1 to request release of the bus 12, thereby holding the bus 12. Upon receiving an HLDA signal from the CPU 1, the DMA 6 delivers a DACK 1 to the device 4 and simultaneously outputs a data read request to the device 4 via the bus 12.

The DMA 6 reads out data #1 from the device 4 which has been rendered active by the signal DACK 1 and retains it within itself. Then, the DMA 6 stops output of signal DACK 1 and renders the device 4 inactive.

Subsequently, the DMA 6 writes the retained data #1 in the buffer memory area 27 of the memory 2. Specifically, the data #1 is written at an address of the memory 2 designated by the DMA 6 by the control of the memory controller 3.

At this time, in the buffer memory management unit 9, the access detecting unit 22 compares the address of the buffer memory area 27 which was designated by the area designating unit 21 with the address at which the data #1 is written. When the access to the buffer memory area 27 is determined, the access detecting unit 22 outputs the count-up control signal and clock signal CLK to the up-down counter 23 in response to the write signal from the CPU 1. The up-down counter 23 receives the count-up control signal and clock signal CLK and outputs the count value "1" to the device control unit 24.

In the device control unit 24, the comparator 35 compares counter value "1" with an input B having value "0". The comparator 35 outputs device control signal 8 having value "1" to the access control unit 11. Upon receiving the device control signal 8 having value "1", the access control unit 11 permits the read access request by the device 5. Specifically, the data which can be read out was stored in the buffer memory area 27 of the memory 2. As a result, the AND circuit 14 in the access control unit 11 receives the device control signal 8 having value "1" and request signal having value "1" from the device 5 and outputs signal with value "1" and thus the access control unit 11 delivers signal DREQ2 to the DMA 6.

Upon receiving signal DREQ2, the DMA6 outputs a HOLD signal to the CPU 1 to request release of the bus 12, thereby holding the bus 12. Upon receiving an HLDA signal from the CPU 1, the DMA 6 outputs a read request for data #1 to the memory 2 via the bus 12.

The DMA 6 reads out the data #1 from the buffer memory area 27 of the memory 2 by the control of the memory controller 3 and retains it in itself. Thereafter, the DMA 6 delivers the DACK2 to the device 5 in reply and simultaneously outputs a data write request to the device 5 via the bus 12. Thus, the data #1 is written in the device 5.

At this time, in the buffer memory management unit 9, the access detecting unit 22 compares the address of the buffer memory area 27 which was designated by the area designating unit 21 with the address from which the data #1 was read out. When the access to the buffer memory area 27 is determined, the access detecting unit 22 outputs the count-down control signal and clock signal CLK to the up-down counter 23 in response to the read signal from the CPU 1. The up-down counter 23 receives the count-down control signal and clock signal CLK and outputs the count value "0" to the device control unit 24.

In the device control unit 24, the comparator 35 compares the counter value "0" with the input B having set value "0" and outputs the device control signal 8 having value "0" to the access control unit 11. Upon receiving the device control signal 8 with value "0", the access control unit 11 disables the read access request by the device 5. That is, no data can be read out from the buffer memory area 27 of the memory 2.

In FIGS. 8A to BE, if data #2 is written in the buffer memory area 27 from the device 4, the count value of the up-down counter 23 becomes "1". Subsequently, if data #3 is written, the count value of the up-down counter 23 becomes "2". If data #4 and data #5 is written in the buffer memory area 27, the count value of the up-down counter 23 becomes "4" and the capacity of the buffer memory area 27 designated by the area designating unit 21 is filled.

In the device control unit 24, the comparator 36 compares the count value "4" with the count value "4" of the buffer memory capacity of the buffer memory area 27, and outputs the device control signal 7 having value "0" to the access control unit 10. As a result, even if the write access request signal "1" is output from the device 4, the AND circuit 13 in the access control unit 10 does not output the signal DREQ1 to the DMA 6 since the AND circuit 10 receives the device control signal 7 with value "0". In other words, since the buffer memory capacity of the buffer memory area 27 is filled, the write access by the device 4 is disabled.

On the other hand, the comparator 35 in the device control unit 24 is comparing the count value of the up-down counter 23 with the input B with set value "0". Since the data #2 was written in the buffer memory area 27 of the memory 2, the value "1" has been output as device control signal 8.

If the read access request signal is output from the device 5, the AND circuit 14 in the access control unit 11 receives the request signal "1" and device control signal 8 with value "1" and outputs the DREQ2 signal 2 having value "1" to the DMA 6. Upon receiving the signal DREQ2, the DMA 6 reads out the data #2 from the buffer memory area 27 of the memory 2 and writes the data #2 in the device 5.

In this manner, if the data #2 is read out from the buffer memory area 27 of the memory 2 by the DMA 6, the count value of the up-down counter 23 becomes "3". Accordingly, in the device control unit 24, the comparator 36 compares the count value "3" of the up-down counter 23 with the count value "4" of the buffer memory capacity and outputs the device control signal 7 having value "1" to the access control unit 10.

In the access control unit 10, if the AND circuit 13 receives the device control signal 7 with value "1" and the write access request signal "1" from the device 4, the AND circuit 13 outputs the DREQ1, the value of which has been changed to "1" once again, to the DMA 6. As a result, the write access by the device 4 is enabled once again.

By repeating the control by means of the device control signals 7 and 8 from the buffer memory management unit 9, the devices 4 and 5 are enabled to output request signals irrespective of the data storage state of the buffer memory area 27. In addition, overhead due to wait time and running of software does not occur, and the non-synchronous data transmission can be effected at high speed.

A description will now be given of the case where data width is different between the device 4 and device 5, for example, the case where data access is performed under the condition that the data width of the device 4 is in units of 1 byte and that of the device 5 is in units of 2 bytes.

Specifically, in the case of the read access of the device 5, the CPU 1 outputs, to the counter control unit 34, a clock control signal and a read signal corresponding to the 2-byte unit of the data width of the device 5.

The counter control unit 34 receives this clock control signal and read signal and outputs the clock signal CLK to the up-down counter 23 in units of 2 clocks. Thus, the count value of the up-down counter 23 is decreased in units of "2", and thereby the data storage state of the buffer memory area 27 is detected.

At this time, the CPU 1 delivers input B of set value "1" to the comparator 35 of the device control unit 24, so that when two bytes or more data is stored in the buffer memory area 27, the device control signal 8 may have value "1" and the read access of the device 5 is enabled.

Inversely, in the case where data transfer is performed under the condition that the data width of the device 4 is in units of 2 bytes and that of the device 5 is in units of 1 byte, the CPU 1 outputs, to the counter control unit 34, a clock control signal and a write signal corresponding to the 2-byte unit of the data width of the device 4 when the access by the device 4 is effected.

The counter control unit 34 receives this clock control signal and write signal, outputs the clock signal CLK to the up-down counter 23 in units of 2 clocks and increases the count value of the up-down counter 23 in units of "2". Thereby, the data storage state of the buffer memory area 27 is detected.

At this time, the CPU 1 sets the buffer capacity data in the area designating unit 21 to "buffer capacity-1", and the input B representing "buffer capacity-1" is supplied to the comparator 36 of the device control unit 24.

In this manner, the CPU 1 controls the variation amount of the count value of the up-down counter 23 in accordance with the access data width. Thereby, high-speed data transmission with optimal data width can be performed even in the case where the data width differs between the device 4 and device 5.

In the above embodiment, two devices have been employed. However, three or more devices may be used, with each device being provided with the device control unit which is controlled by the buffer memory management unit.

The present invention is not limited to the above embodiment. For example, this invention is applicable to a system using a master device.

In FIG. 9, a master device is used as device 15. A HOLD signal and a HLDA signal are controlled by an access control unit 16 and a HOLD control unit 17. Thereby, non-synchronous data transfer is performed, like the above-described embodiment.

The buffer memory area 27 of the memory 2 may be defined by the top address and the end address, if the area is indicated.

Figure 10:
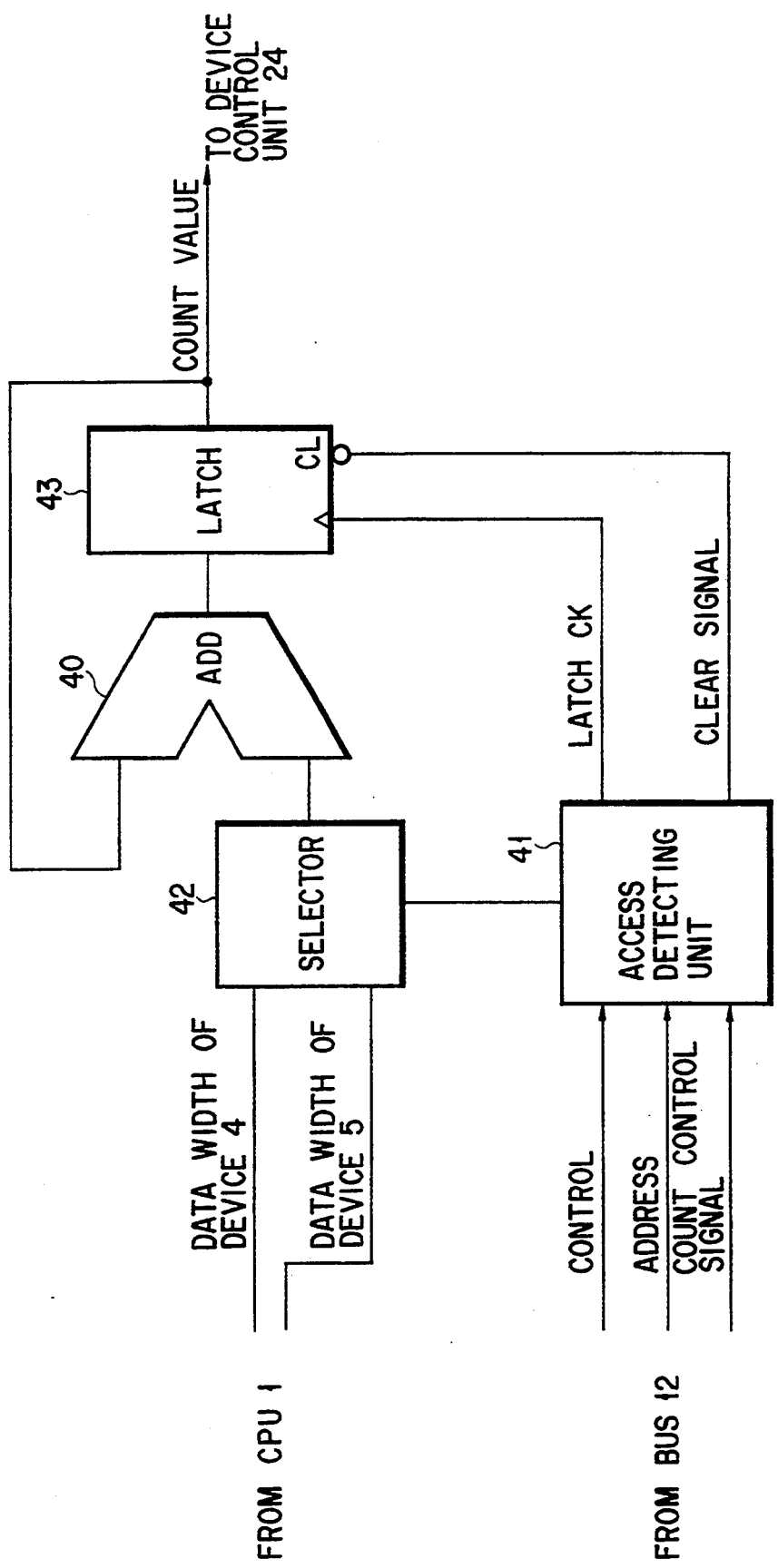
FIG. 10 shows another example of the structure for detecting the data storage state of a buffer memory area.

The up-down counter 23 for detecting the data storage state of the buffer memory area 27 of the memory 2 may not be an "up-down counter", and it may be replaced by two counters. In this case, a difference in count value between these counters is found. Alternatively, as shown in FIG. 10, an adder may be used. In this case, the CPU 1 selects addition data according to the data width when data is written, and a complement of "2" is employed for subtraction when data is read out. Any structure may be adopted if the data storage state of the buffer memory area 27 is detected.

This invention is applicable to a system having two or more buses.

Figure 11:
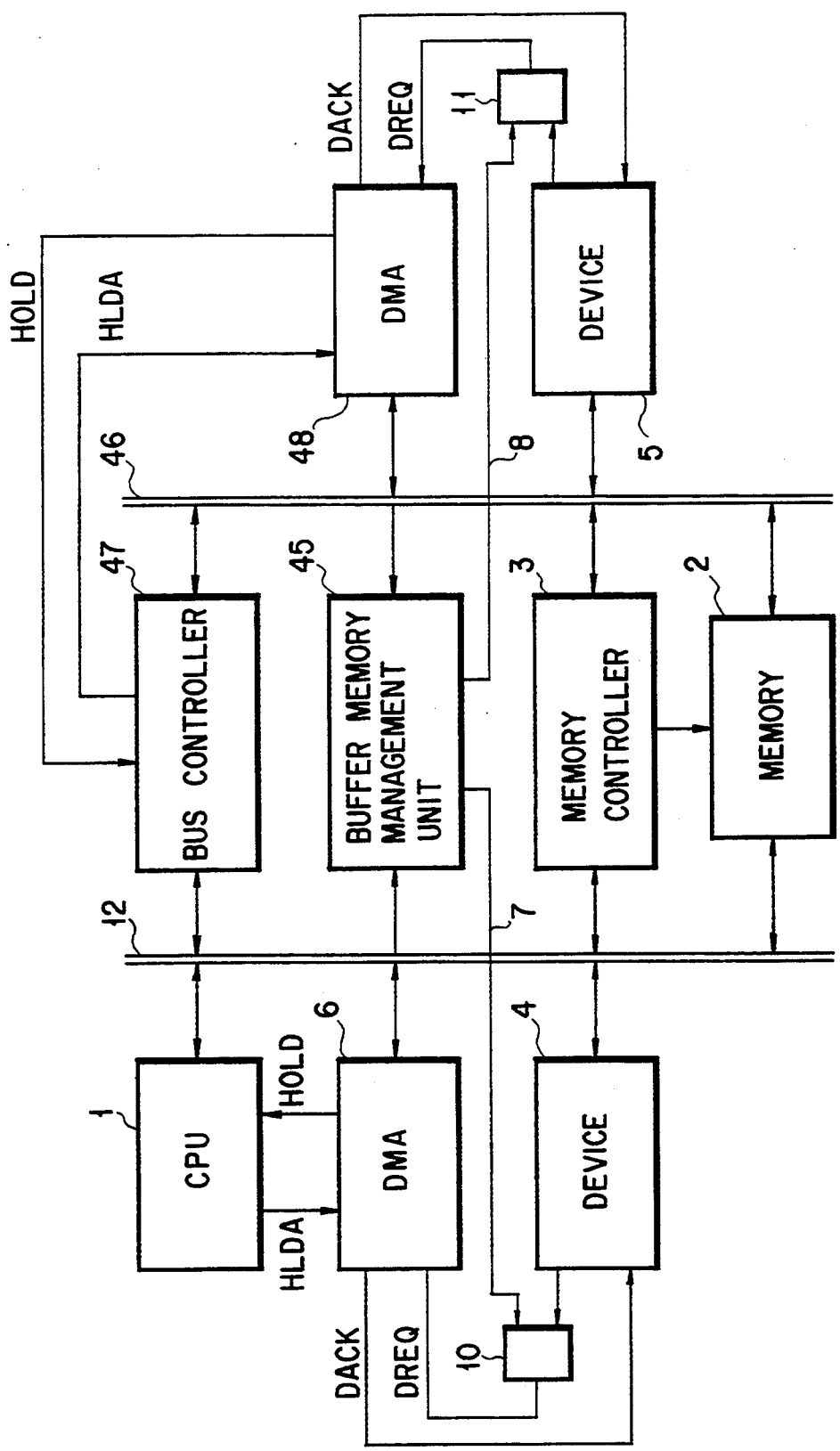
FIG. 11 shows schematically the structure of still another embodiment of the invention.
Figure 12:
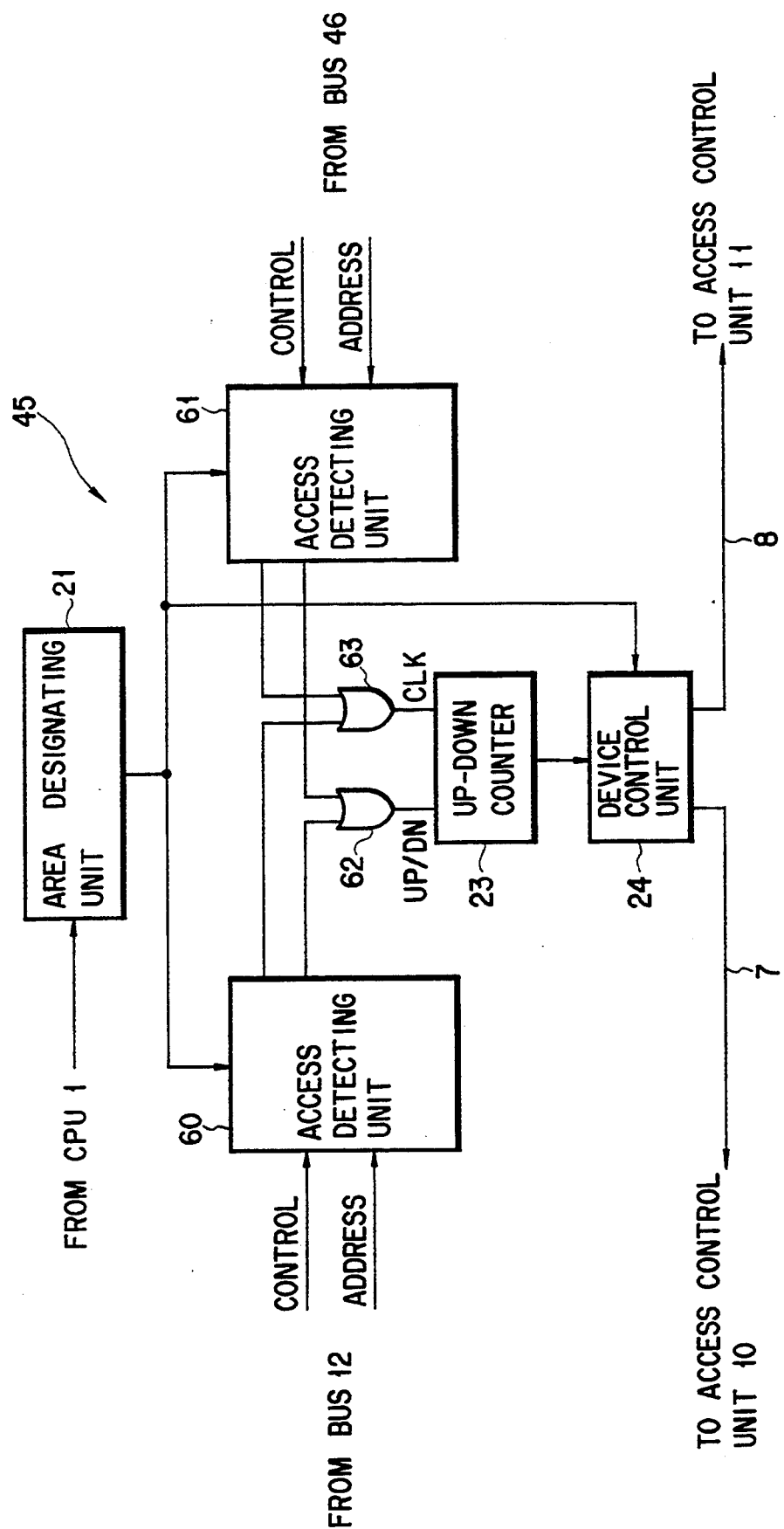
FIG. 12 shows schematically the structure of a buffer memory management unit applied to the system having two buses.

FIG. 11 shows a system having two buses 12 and 46. A buffer memory management unit 45 is connected to the two buses 12 and 46. As is shown in FIG. 12, the buffer memory management unit 45 is provided with access detection units 60 and 61 for the buses 12 and 46, and thereby this system is constituted. With this structure, the devices 4 and 5 can be operated in parallel completely, and high-speed data transfer can be effected via the buffer memory area 27 of the memory 2.

FIG. 13 shows another system having two buses 12 and 46. A buffer management unit 45 are connected to the two buses 12 and 46. Like the above structure, the devices 4 and 5 can be operated in parallel completely, and high-speed data transfer can be effected via the buffer memory area 27 of the memory 2.

As has been described above, according to the present invention, the need to synchronize data transfer between devices with different processing speeds is eliminated by adding a simple circuit.

The present invention overcomes the drawback of the double buffer system: until one of the buffers is filled, one of the devices cannot operate, and a software control occurs when the buffers are switched.

Furthermore, while each device is being operated, the access control unit controls the access request by each device by means of control signals corresponding to the storage state of the buffer memory. Therefore, high-speed data transfer is possible.

In addition, since a buffer memory is defined within a conventional memory, it is not necessary to mount a special memory and it is possible to optionally set the capacity of a buffer memory area according to conditions.

Furthermore, even if the data width for a single data transfer operation differs between devices, it is not necessary to provide means for matching data transfer width. Therefore, the present invention is applicable to devices of any data transfer width.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An apparatus for transferring data from a first device to a second device, comprising:
   a buffer memory for temporarily storing data from said first device, said buffer memory having a predetermined data capacity;
   area designating means for designating, in said buffer memory, a memory area for storing data transferred from said first device;
   means for detecting an amount of data stored in said buffer memory;
   first access means for accessing said buffer memory to transfer data from said first device to said buffer memory, said first access means including first control means for disabling data transfer when said detecting means detects that said amount of data stored in said buffer memory is equal to said predetermined data capacity; and
   second access means for accessing said buffer memory to transfer data from said buffer memory to said second device, said second access means including second control means for disabling data access when said detecting means detects that no data is stored in said buffer memory.

2. The apparatus according to claim 1, wherein said area designating means includes means for defining a top address of said memory area and a memory capacity of said memory area.

3. An apparatus for transferring data from a first device to a second device, comprising:
   a buffer memory for temporarily storing data from said first device, said buffer memory having a predetermined data capacity;
   means for detecting an amount of data stored in said buffer memory;
   first access means for accessing said buffer memory to transfer data from said first device to said buffer memory, said first access means including first control means for disabling data transfer when said detecting means detects that said amount of data stored in said buffer memory is equal to said predetermined data capacity; and second access means for accessing said buffer memory to transfer data from said buffer memory to said second device, said second access means including second control means for disabling data access when said detecting means detects that no data is stored in said buffer memory, said first access means including first data transfer means for transferring data with a first data transfer width, and said second access means including second data transfer means for transferring data with a second data transfer width which is different from said first data transfer width.

4. The apparatus according to claim 3, further comprising means for executing data transfer by controlling said first and second access means in accordance with said amount of data stored in said buffer memory detected by said detecting means and said first and second data transfer widths.

5. The apparatus according to claim 4, wherein said executing means includes means for counting said amount of data stored in said buffer memory to obtain a count value and said amount of data transferred from said buffer memory, and means for controlling said count value of said counting means in accordance with said first and second data transfer widths.

* * * * *